United States Patent [19]
Vernon et al.

[11] Patent Number: 6,010,600
[45] Date of Patent: Jan. 4, 2000

[54] MASKLESS DEPOSITION TECHNIQUE FOR THE PHYSICAL VAPOR DEPOSITION OF THIN FILM AND MULTILAYER COATINGS WITH SUBNANOMETER PRECISION AND ACCURACY

[75] Inventors: Stephen P. Vernon, Pleasanton; Natale M. Ceglio, Livermore, both of Calif.

[73] Assignee: The Regents of the University of California, Oakland, Calif.

[21] Appl. No.: 08/607,054

[22] Filed: Feb. 22, 1996

[51] Int. Cl.$^7$ .............................. C23C 14/00; C23C 16/00
[52] U.S. Cl. ..................... 204/192.11; 427/596; 427/580; 427/255.11; 204/192.12; 204/298.28
[58] Field of Search .......................... 204/192.11, 298.26, 204/298.28, 192.12; 427/251, 255, 596, 580, 255.11

[56] References Cited

U.S. PATENT DOCUMENTS

| | | | |
|---|---|---|---|
| 5,087,476 | 2/1992 | Tohma et al. .......................... | 427/251 |
| 5,112,644 | 5/1992 | Seddon et al. ..................... | 204/298.28 |
| 5,240,583 | 8/1993 | Ahonen ............................... | 204/298.28 |
| 5,334,302 | 8/1994 | Kubo et al. ......................... | 204/298.28 |
| 5,370,737 | 12/1994 | Mathis ............................... | 204/298.28 |

*Primary Examiner*—Shrive Beck
*Assistant Examiner*—Bret Chen
*Attorney, Agent, or Firm*—John P. Wooldridge

[57] ABSTRACT

The invention is a method for the production of axially symmetric, graded and ungraded thickness thin film and multilayer coatings that avoids the use of apertures or masks to tailor the deposition profile. A motional averaging scheme permits the deposition of uniform thickness coatings independent of the substrate radius. Coating uniformity results from an exact cancellation of substrate radius dependent terms, which occurs when the substrate moves at constant velocity. If the substrate is allowed to accelerate over the source, arbitrary coating profiles can be generated through appropriate selection and control of the substrate center of mass equation of motion. The radial symmetry of the coating profile is an artifact produced by orbiting the substrate about its center of mass; other distributions are obtained by selecting another rotation axis. Consequently there is a direct mapping between the coating thickness and substrate equation of motion which can be used to tailor the coating profile without the use of masks and apertures.

36 Claims, 1 Drawing Sheet

MASKLESS DEPOSITION TECHNIQUE FOR THE PHYSICAL VAPOR DEPOSITION OF THIN FILM AND MULTILAYER COATINGS WITH SUBNANOMETER PRECISION AND ACCURACY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to methods of making thin film and multilayer coatings, and more specifically, it relates to a method for the production of axially symmetric, graded and ungraded thickness thin film and multilayer coatings that avoids the use of apertures or masks to tailor the deposition profile.

2. Description of Related Art

The ability to provide spatially varying thin film and multilayer coatings is essential for several advanced technologies. In particular, it is critical to developing optical fabrication techniques capable of fulfilling the requirements of soft x-ray or extreme ultra violet projection lithography (SXPL or EUVL). Large field EUVL imaging systems will require multiple aspheric optical elements figured to subnanometer accuracy. In order to achieve the optimum imaging performance, graded period multilayer (ML) coatings must be deposited on these aspheric surfaces with gradients of 1 part in $10^9$. This corresponds to a ML period variation of 1 Å across a 10 cm diameter substrate. This is a demanding requirement since the ML coating distribution is, in general, a complicated function of source and substrate variables.

For example, consider physical vapor deposition onto a stationary substrate. During time t, the substrate surface will acquire a coating thickness T at a position (x,y,z) given by $$T(x, y, z, t) = \int_0^t \Phi(x, y, z, t')S(x, y, z, t')G(x, y, z, t')dt'. \quad (1.1)$$

Here, $\Phi$ is the flux of depositing species, S is the sticking coefficient and G accounts for effects associated with the substrate geometry. In general all of these quantities are position and time dependent. Frequently, the sticking coefficient will only exhibit a weak spatial and temporal dependence and is assumed to be constant, $S(x,y,z,t')=S$. Also, provided that the deposited coating(s) produce only slight changes in the substrate shape, G is time independent and (1.1) reduces to $$T(x, y, z, t) = SG(x, y, z)\int_0^t \Phi(x, y, z, t')dt'. \quad (1.2)$$

Only in the case where $\Phi(x,y,z,t)=\Omega(x,y,z)\Gamma(t)$ are variations arising from spatial influences and temporal fluctuations separable, giving $$T(x, y, z, t) = SG(x, y, z)\Omega(x, y, z)\int_0^t \Gamma(t')dt'. \quad (1.3)$$

Suppose that a uniform coating is desired. Inserting a mask with an aperture function $A(x,y,z)=C_0S^{-1}G^{-1}(x,y,z)\Omega^{-1}(x,y,z)$ between the source and substrate will yield a film thickness given by $$T(x, y, z, t) = C_0\int_0^t \Gamma(t')dt'. \quad (1.4)$$

Here A(x,y,z) depends upon both source and substrate characteristics. Note that a different aperture is required for each source-substrate combination even in this simple case. In most systems the spatial and temporal fluctuations that arise in the deposition process are not separable. In general, provision must be made for complex relative motion(s) of the source(s) and substrate(s) to provide for spatial and temporal averaging of the deposition process, inserting masks to approach the desired coating profile(s). At best this is a tedious and inefficient process that is inappropriate for a robust manufacturing technique. In fact it is not clear that these techniques have the capability of accessing controlled deposition profiles with an accuracy of 1 part in $10^9$.

SUMMARY OF THE INVENTION

It is an object of the present invention to provide a method for the production of axially symmetric, graded and ungraded thickness thin film and multilayer coatings that avoids the use of apertures or masks to tailor the deposition profile.

A motional averaging scheme permits the deposition of uniform thickness coatings independent of the substrate radius. An exact cancellation of substrate radius dependent terms, which occurs when the substrate moves at constant velocity results in coating uniformity. By accelerating the substrate over the source, arbitrary coating profiles can be generated through appropriate selection and control of the substrate center of mass equation of motion. The radial symmetry of the coating profile is an artifact produced by orbiting the substrate about its center of mass; other distributions are obtained by selecting another rotation axis. Consequently there is a direct mapping between the coating thickness and substrate equation of motion which can be used to tailor the coating profile without the use of masks and apertures.

The method begins by translating a substrate at a selected velocity $V_0$, through at least one deposition source, where the substrate having a known diameter $d_s$, and the translation is in the x direction of the x-y plane within an x-y-z Cartesian coordinate system. As the substrate is translated, it is rotated at a selected angular velocity $\omega_0$ about the z axis of the x-y-z- Cartesian coordinate system. While angular velocity $\omega_0$ is constant about the z axis, the translation velocity $V_0$ may be constant in the x direction to produce a uniform coating profile, or translation velocity $V_0$ may be measured instantaneously, while the substrate is accelerated to produce a graded coating thickness profile. In one embodiment of the invention, the source and substrate have relative spatial dimensions such that $d_0$, $d_{max}>d_{min}>d_s$, where $d_0$ is source displacement, $d_{max}$ is source y dimension, $d_{min}$ is source x dimension and $d_s$ is substrate diameter. In this case, $d_s\omega_0>>V_0$, $V_0$, where $d_s$ is substrate diameter, $\omega_0$ is angular velocity and $V_0$ is velocity, and y directed variations in source uniformity are dominated by departures of odd symmetry with respect to the substrate center. Arbitrary coating profiles are generated through selection and control of the center of mass equation of motion for the substrate. Radial symmetry is produced by orbiting the substrate about its center of mass, where the symmetry about any point is obtained by rotation of the substrate about that point. The film thickness at a given substrate location is determined by the time that portion of the substrate is exposed to said source.

DETAILED DESCRIPTION OF THE INVENTION

Figure 1:
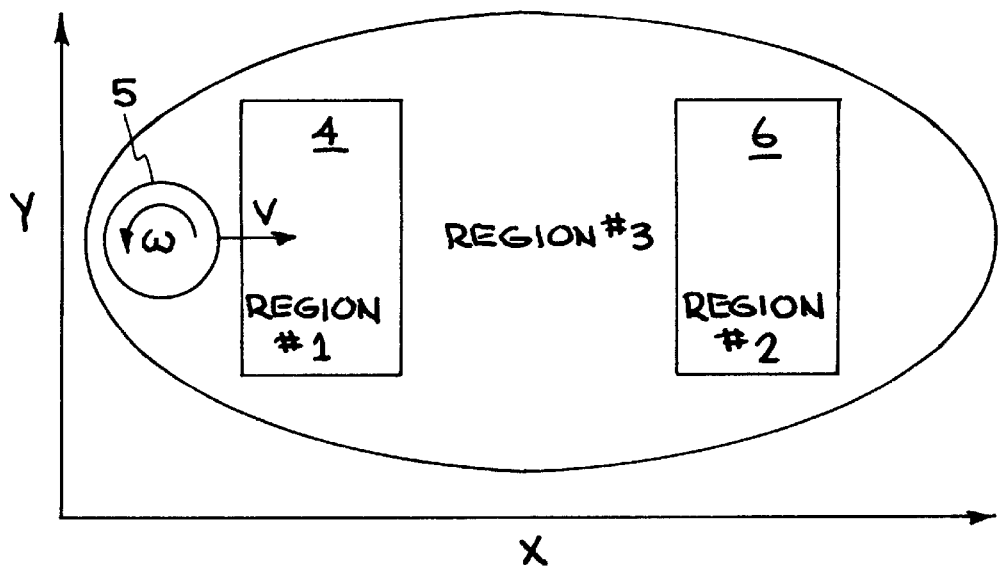
FIG. 1 shows a physical vapor deposition system (PVDS) which contains two well separated deposition sources.

The invention is a method for the production of axially symmetric, graded thickness thin film and multilayer coatings that avoids the use of apertures or masks to tailor the deposition profile. FIG. 1 shows a physical vapor deposition system (PVDS) which contains two (2) well separated deposition sources (i.e., thermal sources, e-beam hearths, primary ion beam sources, ion beam sputtering sources, magnetrons etc.). In this context "well separated" means that the respective effluent from only one source can be applied to the substrate at a given time, i.e., simultaneous co-deposition from both sources is not possible. Thus the vacuum vessel comprising the PVDS contains three specific regions: Region 1, where the effluent from source 4 is deposited onto the substrate 5; Region 2, where the effluent from source 6 is deposited onto the substrate 5; and Region 3, where no coating occurs. For the purposes of this discussion, assume that the sources are spatially separated in such a fashion that Regions 1 and 2 are embedded within Region 3, so that the substrate 5 must pass through Region 3 if it is moved from Region 1 to Region 2, or from Region 2 to Region 1.

Where the sources are rectangular as in FIG. 1, their maximum dimension, $d_{max}$, is in the y direction and their minimum dimension, $d_{min}$, is in the x direction. The sources are displaced by a distance $d_0$ along the x-axis. Spatial dimensions are such that $d_0$, $d_{max} > d_{min} > d_s$, where $d_s$ is the substrate diameter. A combination of substrate translation at constant velocity, $V_0$, in the x direction, combined with substrate rotation at angular velocity, $\omega_0$, about the z axis are employed to provide spatial averaging of the deposition sources. The choice of rectangular source geometry and linear substrate translation facilitate the mathematical development. The results are, however, quite general and are applicable to other source geometries and substrate motions including but not restricted to the case of circular (orbital) substrate motions over stationary rectangular sources. This averaging scheme can only be effective provided that $d_s \omega_0 >> V_0$, and y directed variations in source uniformity are dominated by departures of odd symmetry with respect to the substrate center (i.e. $1^{st}$, $3^{rd}$, $5^{th}$ . . . order in y). In a situation where the above conditions are satisfied, uniform thin film coatings will be deposited upon the substrate as it transits Regions 1 and 2. Coating thicknesses are inversely proportional to the transit velocity, $V_0$. The mathematical development is most tractable in the case where the flux is uniform over the sources, i.e., $\Phi(x,y,z)=\Phi_0$ in Regions 1 and 2, and, $\Phi(x,y,z)=0$, otherwise; however, the results are applicable to more general flux distributions.

Figure 2:
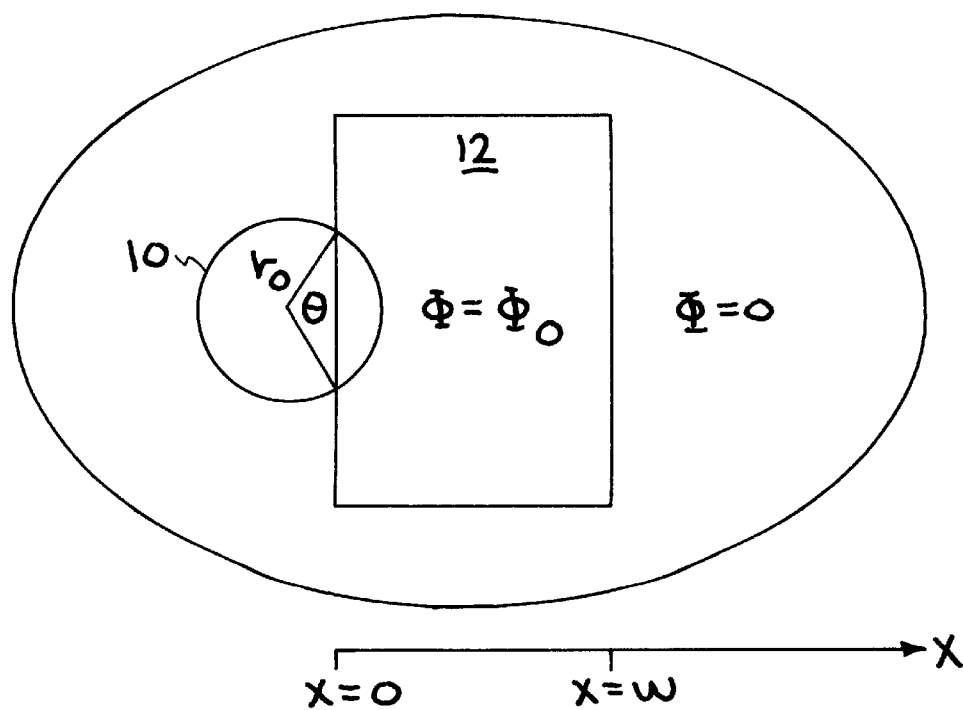
FIG. 2 describes a PVDS which contains one deposition source and an annular substrate of radius $r_0$, and negligible width.

Consider an annular substrate 10 of radius $r_0$, and negligible width as shown in FIG. 2, moving at velocity $V_0$ in the positive x direction over a physical vapor deposition source 12 which provides a constant flux $\Phi$ for the region of space, $0<x<W$. The center of mass of the annulus obeys the following equation of motion $$x_{cm}(t)=-r_0+v_0 t \quad (2.1).$$

and the annulus rotates at an angular velocity $\omega_0$ about its center of mass such that $\omega_0 r_0 >> V_0$. An expression will be developed for the total film thickness, $\Lambda$, deposited on the annulus as the substrate center of mass moves from $x_{cm}(t) < -r_0$ to $x_{cm}(t) > W + r_0$. For $x_{cm}(t) < -r_0$, and $x_{cm}(t) > W + r_0$ the substrate is in a region where $\Phi(x,y,z)=0$, deposition only occurs over the region $-r_0 < x_{cm}(t) < W + r_0$. During time $$T = \frac{2r_0}{v_0},$$

the substrate moves from $-r_0 < x_{cm}(t) < +r_0$ and transits the boundary of the source. At a given position $x(t)$, only a fraction of the arc $\Theta(t)$, is exposed to the flux, where $$\Theta(t)=2\cos^{-1}(x(t)/r_0) \quad (2.2).$$

Therefore the substrate acquires a coating thickness $\Lambda(T)$ given by $$\Lambda(T) = \frac{\Phi_0}{2\pi} \int_0^T \Theta(t) dt \quad (2.3)$$

in transiting the boundary of the source. Substituting (2.2) into (2.3) and transforming the limits of integration gives $$\Lambda(r_0) = \frac{\Phi_0}{\pi v_0} \int_{-r_0}^{+r_0} \cos^{-1}\left(\frac{x}{r_0}\right) dx = \frac{\Phi_0 r_0}{v_0}. \quad (2.4)$$

For $+r_0 < x(t) < W - r_0$, the substrate is exposed to the uniform flux $\Phi_0$, for a time $$T_u = \frac{W - 2r_0}{v_0},$$

and acquires a coating thickness $$\Lambda(W - r_0) = \Phi_0 \frac{(W - 2r_0)}{v_0}. \quad (2.5)$$

For $W - r_0 < x(t) < W + r_0$ the substrate, once again, transits the boundary of the source and acquires a coating thickness $$\Lambda(W + r_0) = -\frac{\Phi_0}{\pi v_0} \int_{W-r_0}^{W+r_0} \cos^{-1}\left(\frac{W-x}{r_0}\right) dx = \frac{\Phi_0 r_0}{v_0}. \quad (2.6)$$

The total coating thickness is independent of the substrate radius, $r_0$, and is given by $$\Lambda_{Total} = \Lambda(r_0) + \Lambda(W - r_0) + \Lambda(W + r_0) \quad (2.7)$$
$$= \Phi_0 \left[\left(\frac{W - 2r_0}{v_0}\right) + 2\left(\frac{r_0}{v_0}\right)\right]$$
$$= \Phi_0 \frac{W}{v_0}.$$

The motional averaging scheme described above permits the deposition of uniform thickness coatings independent of the substrate radius provided that $2r_0<W$. The uniformity results from an exact cancellation of r dependent terms embodied in Eqs. 2.4–2.6 above which occurs when the substrate moves at constant velocity $V_0$. If this restriction is relaxed and the substrate is allowed to accelerate over the source, equations 2.4–2.6 assume the form $$\Lambda(r) = \frac{\Phi_0}{2\pi} \int_{t_i}^{t_f} \Theta(r, t) dt. \tag{3.1}$$

where $\theta(r,t)=2\cos^{-1}((r_0-x_{cm}(t))/r)$ for $r_0-r<x_{cm}(t)\leq r_0-r$ and $w-r\leq x_{cm}(t)\leq W-r$ and $\theta(r,t)=2\pi$ for $r_0+r<x_{cm}(t)<W-r$. The coating distribution is radially symmetric and has a r dependent thickness profile given by $$\Lambda(r) = \Phi_0 \left[ (t_3 - t_2) + \frac{1}{\pi} \int_{t_1}^{t_2} \cos^{-1}\left(\frac{r_0 - x_{\mathrm{cm}}(t)}{r}\right) dt + \frac{1}{\pi} \int_{t_3}^{t_4} \cos^{-1}\left(\frac{x_{\mathrm{cm}}(t) - W}{r}\right) dt \right] \tag{3.2}$$

where $x_{cm}(t_1)=r_0-r$, $x_{cm}(t_2)=r_0+r$, and $x_{cm}(t_3)=W-r$, $x_{cm}(t_4)=W+r$. From Eq. 3.1 it is evident that arbitrary coating profiles can be generated through appropriate selection and control of the substrate center of mass equation of motion (The radial symmetry of the coating profile is an artifact produced by orbiting the substrate about its center of mass; other distributions are obtained by selecting another rotation axis). Consequently there is a direct mapping between the coating thickness and substrate equation of motion which can be used to tailor the coating profile without the use of masks and apertures.

The method allows tailoring of the gradients to extremely high precision in that the film thickness at a given substrate location is determined by the time that portion of the substrate is exposed to the source. For EUV lithography at 13 nm the ML periods are of order 7 nm. Sputter deposited coatings are grown at deposition rates of ~0.2 nm/sec so a gradient of 0.1 nm corresponds to variations in residence times of 0.5 sec out of a total exposure time of 35 sec or 1 part in 70. In the implementation described above, thickness control is achieved via instantaneous control of the substrate velocity as it transit the source; commercially available stepper motors yield resolutions of 1 part in $10^6$ and stabilities of better than 1 part in $10^4$. These requirements significantly exceed those posed by EUVL applications. Extensions to other thin film systems, coating geometries, substrate motions and source distributions are straightforward.

Changes and modifications in the specifically described embodiments can be carried out without departing from the scope of the invention, which is intended to be limited by the scope of the appended claims.

We claim:

1. A maskless method for the physical vapor deposition of thin film and multilayer coatings, comprising:

providing a substrate having a diameter $d_s$ and a substrate surface;

passing said substrate through at least one deposition source at a velocity V;

simultaneously translating said substrate non-linearly in the x direction of the x-y plane within an x-y-z Cartesian coordinate system, wherein said velocity is controlled to a resolution of at least 1 part in $10^4$, wherein the thickness of said thin film and multilayer coatings is controlled through instantaneous control of said velocity V;

depositing a coating on the translated substrate wherein the thickness of the coating at a time t is given by:

$$T(x, y, z, t) = \int_0^t \Phi(x, y, z, t') S(x, y, z, t') G(x, y, z, t') dt',$$

wherein, $\Phi$ is the flux of depositing species, S is the sticking coefficient and G accounts for effects associated with the substrate geometry; and rotating said substrate at an angular velocity $\omega_0$ about the z axis of said x-y-z- Cartesian coordinate system.

2. The method of claim 1, wherein velocity V is constant in the x direction, and angular velocity $\omega_0$ is constant about the z axis.

3. The method of claim 1, wherein said at least one deposition source is selected from the group consisting of a thermal source, an e-beam hearth, a primary ion beam source, an ion beam sputtering source and a magnetron.

4. The method of claim 1, wherein said substrate is translated through at least one deposition source, said translation being in the x direction of the x-y plane within an x-y-z Cartesian coordinate system.

5. The method of claim 1, wherein said substrate is translated through at least one rectangular deposition source, said translation being in the x direction of the x-y plane within an x-y-z Cartesian coordinate system.

6. The method of claim 1, wherein said substrate is translated through at least one non-rectangular deposition source, said translation being in the x direction of the x-y plane within an x-y-z Cartesian coordinate system.

7. The method of claim 1, wherein said substrate is translated through at least one stationary deposition source, said translation being in the plus and minus x direction of the x-y plane within an x-y-z Cartesian coordinate system.

8. The method of claim 1, wherein said at least one deposition source and said substrate comprise spatial dimensions such that source displacement, source y dimension>source x dimension>substrate diameter.

9. The method of claim 1, wherein $d_s\omega_0>>V_0$, where $\omega_0$ is angular velocity and $V_0$ is velocity, wherein y directed variations in source uniformity are dominated by departures of odd symmetry with respect to the substrate center.

10. The method of claim 1, wherein total coating thickness is independent of the substrate radius, $r_0$, and is given by $$\Lambda_{Total} = \Lambda(r_0) + \Lambda(W - r_0) + \Lambda(W + r_0)$$
$$= \Phi_0 \left[ \left(\frac{W - 2r_0}{v_0}\right) + 2\left(\frac{r_0}{v_0}\right) \right]$$
$$= \Phi_0 \frac{W}{v_0}$$

where $$\Lambda(r_0) = \frac{\Phi_0}{\pi v_0} \int_{-r_0}^{+r_0} \cos^{-1}\left(\frac{x}{r_0}\right) dx = \frac{\Phi_0 r_0}{v_0},$$

$$\Lambda(W - r_0) = \Phi_0 \frac{(W - 2r_0)}{v_0} \quad \text{and}$$

$$\Lambda(W + r_0) = -\frac{\Phi_0}{\pi v_0} \int_{W-r_0}^{W+r_0} \cos^{-1}\left(\frac{W - x}{r_0}\right) dx = \frac{\Phi_0 r_0}{v_0}$$

where $\Phi_0$ is uniform flux, $V_0$ is substrate translation at constant velocity $r_0$ substrate radius, x is the position in the x direction of an x,y,z, Cartesian coordinate system and W is the width of the deposition source.

11. The method of claim 1, wherein said translation includes a non-linear acceleration in said x direction.

12. The method of claim 11, wherein y directed variations in source uniformity are dominated by departures of odd symmetry with respect to the substrate center.

13. The method of claim 12, wherein coating thickness is $$\Lambda(r) = \frac{\Phi_0}{2\pi} \int_{t_i}^{t_f} \Theta(r, t) dt$$

where $\Theta$ is the fraction of the arc that is exposed to the flux, r is substrate radius and t is the time of exposure at a particular position, wherein the coating distribution is radially symmetric.

14. The method of claim 13, wherein the coating distribution has a r dependent thickness profile given by $$\Lambda(r) = \Phi_0 \left[ (t_3 - t_2) + \frac{1}{\pi} \int_{t_1}^{t_2} \cos^{-1}\left(\frac{r_0 - x_{cm}(t)}{r}\right) dt + \frac{1}{\pi} \int_{t_3}^{t_4} \cos^{-1}\left(\frac{x_{cm}(t) - W}{r}\right) dt \right]$$

where $\Phi_0$ is uniform flux over said source, $x_{cm}(t_1)=r_0-r$, $x_{cm}(t_2)=r_0+r$, and $x_{cm}(t_3)=W-r$, $x_{cm}(t_4)=W+r$.

15. The method of claim 16, wherein a substrate is characterized by a center of mass equation of motion, wherein arbitrary coating profiles are generated through selection and control of said center of mass equation of motion for said substrate.

16. The method of claim 14, wherein radial symmetry is produced by orbiting said substrate about its center of mass.

17. The method of claim 14, wherein symmetry about any point is obtained by rotation of said substrate about said point.

18. The method of claim 14, wherein said thickness profile at a given substrate location is determined by the time that portion of said substrate is exposed to said source.

19. The method of claim 14, wherein said substrate comprises an annulus.

20. A maskless method for the physical vapor deposition of thin film and multilayer coatings, comprising:

providing a substrate having a diameter ds and a substrate surface;

passing said substrate through at least one deposition source at velocity V;

simultaneously translating said substrate non-linearly in the $\theta$ direction of the r-$\theta$ plane within an r-$\theta$-z cylindrical coordinate system, wherein said velocity is controlled to a resolution of at least 1 part in $10^4$, wherein the thickness of said thin film and multilayer coatings is controlled through instantaneous control of said velocity V;

depositing a coating on the translated substrate wherein the thickness of the coating at a time t is given by:

$$T(r, \theta, z, t) = \int_0^t \Phi(r, \theta, z, t') S(r, \theta, z, t') G(r, \theta, z, t') dt',$$

wherein, $\Phi$ is the flux of depositing species, S is the sticking coefficient and G accounts for effects associated with the substrate geometry; and rotating said substrate at an angular velocity $\omega_0$ about the z axis of said r-$\theta$-z cylindrical coordinate system.

21. The method of claim 20, wherein said at least one deposition source is selected from the group consisting of a thermal source, an e-beam hearth, a primary ion beam source, an ion beam sputtering source and a magnetron.

22. The method of claim 20, wherein said substrate is translated through at least one rectangular deposition source.

23. The method of claim 20, wherein said substrate is translated through at least one non-rectangular deposition source.

24. The method of claim 20, wherein said substrate is translated through at least one stationary deposition source, said translation being in at least one direction of said cylindrical coordinate system.

25. The method of claim 20, wherein said at least one deposition source and said substrate comprise spatial dimensions such that source displacement, source y dimension>source x dimension>substrate diameter.

26. The method of claim 20, wherein $d_s \omega_0 \gg V$, wherein y directed variations in source uniformity are dominated by departures of odd symmetry with respect to the substrate center.

27. The method of claim 20, wherein total coating thickness is independent of the substrate radius, $r_0$, and is given by $$\Lambda_{Total} = \Lambda(r_0) + \Lambda(W - r_0) + \Lambda(W + r_0)$$

$$= \Phi_0 \left[ \left(\frac{W - 2r_0}{v_0}\right) + 2\left(\frac{r_0}{v_0}\right) \right]$$

$$= \Phi_0 \frac{W}{v_0}$$

where $\Phi_0$ is uniform flux over said source, W is the width of the deposition source, $$\Lambda(r_0) = \frac{\Phi_0}{\pi v_0} \int_{-r_0}^{+r_0} \cos^{-1}\left(\frac{x}{r_0}\right) dx = \frac{\Phi_0 r_0}{v_0},$$

$$\Lambda(W - r_0) = \Phi_0 \frac{(W - 2r_0)}{v_0} \quad \text{and}$$

$$\Lambda(W + r_0) = -\frac{\Phi_0}{\pi v_0} \int_{W-r_0}^{W+r_0} \cos^{-1}\left(\frac{W - x}{r_0}\right) dx = \frac{\Phi_0 r_0}{v_0}$$

where $\Phi_0$ is uniform flux, $v_0$ is substrate translation at constant velocity, $r_0$ is substrate radius, x is the position in the x direction of an x,y,z, Cartesian coordinate system and W is the width of the deposition source.

28. The method of claim 20, wherein the step of simultaneously translating said substrate includes a non-linear acceleration in said r direction.

29. The method of claim 28, wherein y directed variations in source uniformity are dominated by departures of odd symmetry with respect to the substrate center.

30. The method of claim 29, wherein coating thickness is $$\Lambda(r) = \frac{\Phi_0}{2\pi} \int_{t_i}^{t_f} \Theta(r, t) dt$$

where $\Theta$ is the fraction of the arc that is exposed to the flux, r is substrate radius and t is the time of exposure at a particular position, wherein the coating distribution is radially symmetric.

31. The method of claim 30, wherein the coating distribution has a r dependent thickness profile given by $$\Lambda(r) = \Phi_0 \left[ (t_3 - t_2) + \frac{1}{\pi} \int_{t_1}^{t_2} \cos^{-1}\left(\frac{r_0 - x_{cm}(t)}{r}\right) dt + \frac{1}{\pi} \int_{t_3}^{t_4} \cos^{-1}\left(\frac{x_{cm}(t) - W}{r}\right) dt \right]$$

where $\Phi_0$ is uniform flux over said source, $x_{cm}(t_1) = r_0 - r$, $x_{cm}(t_2) = r_0 + r$, and $x_{cm}(t_3) = W - r$, $x_{cm}(t_4) = W + r$.

32. The method of claim 31, wherein each substrate is characterized by a center of mass equation of motion, wherein arbitrary coating profiles are generated through selection and control of said center of mass equation of motion for said substrate.

33. The method of claim 31, wherein radial symmetry is produced by orbiting said substrate about its center of mass.

34. The method of claim 31, wherein symmetry about any point is obtained by rotation of said substrate about said point.

35. The method of claim 31, wherein said thickness profile at a given substrate location is determined by the time that portion of said substrate is exposed to said source.

36. The method of claim 31, wherein said substrate comprises an annulus.

* * * * *